(12) United States Patent
Asano

(10) Patent No.: US 8,110,754 B2
(45) Date of Patent: Feb. 7, 2012

(54) MULTI-LAYER WIRING BOARD AND METHOD OF MANUFACTURING THE SAME

(75) Inventor: Toshiya Asano, Ichinomiya (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 405 days.

(21) Appl. No.: 12/412,748

(22) Filed: Mar. 27, 2009

(65) Prior Publication Data

US 2009/0242262 A1 Oct. 1, 2009

(30) Foreign Application Priority Data

Mar. 28, 2008 (JP) ................ P2008-086884

(51) Int. Cl.
*H05K 1/11* (2006.01)
(52) U.S. Cl. .......................................... 174/267; 29/843
(58) Field of Classification Search .............. 174/267, 174/255; 29/843, 825; 361/760, 767
See application file for complete search history.

(56) References Cited

U.S. PATENT DOCUMENTS

| | | | | |
|---|---|---|---|---|
| 5,373,110 A | * | 12/1994 | Inasaka | 174/267 |
| 6,518,518 B1 | * | 2/2003 | Saiki et al. | 174/267 |
| 6,534,723 B1 | * | 3/2003 | Asai et al. | 174/255 |
| 6,623,283 B1 | * | 9/2003 | Torigian et al. | 439/83 |
| 6,988,312 B2 | | 1/2006 | Nakamura et al. | |
| 7,388,296 B2 | * | 6/2008 | Urashima et al. | 257/779 |
| 7,485,017 B2 | * | 2/2009 | Pang et al. | 439/876 |
| 2006/0280919 A1 | * | 12/2006 | Urashima et al. | 428/209 |
| 2009/0052150 A1 | * | 2/2009 | Kobayashi | 361/767 |
| 2009/0242245 A1 | * | 10/2009 | Asano | 174/255 |
| 2009/0294156 A1 | * | 12/2009 | Ueno et al. | 174/255 |
| 2010/0000768 A1 | * | 1/2010 | Maeda et al. | 174/255 |
| 2010/0208437 A1 | * | 8/2010 | Maeda et al. | 361/760 |

* cited by examiner

*Primary Examiner* — Hae Moon Hyeon
(74) *Attorney, Agent, or Firm* — Stites & Harbison PLLC; Jeffrey A. Haeberlin

(57) ABSTRACT

A multi-layer wiring board without a core substrate includes: a multi-layer laminated structure; first terminals provided on a front surface of the multi-layer laminated structure; second terminals provided on a rear surface of the multi-layer laminated structure; terminal pins bonded to a corresponding one of the second terminals, wherein each of the terminal pins is formed in a nailhead shape that includes a shaft portion and a head portion, and a diameter of the head portion is larger than that of the shaft portion; and a reinforcing plate which has pin insertion openings formed at positions corresponding to the terminal pins and which is fixed to the rear surface, wherein the diameter of the pin insertion openings is smaller than the diameter of the head portion and is larger than the diameter of the shaft portion.

5 Claims, 6 Drawing Sheets

MULTI-LAYER WIRING BOARD AND METHOD OF MANUFACTURING THE SAME

CROSS-REFERENCE TO RELATED APPLICATIONS

This application claims priority from Japanese Patent Application No. 2008-086884, filed on Mar. 28, 2008, the entire contents of which are hereby incorporated by reference.

BACKGROUND OF THE INVENTION

1. Technical Field

Devices or methods consistent with the present disclosure relate to a multi-layer wiring substrate that does not include a core substrate.

2. Related Art

In recent years, the process speed of a semiconductor integrated circuit device (IC chip) used as, for example, a microprocessor of a computer has increased, and the functions thereof have been improved. As a result, the number of terminals tends to increase, and the pitch between the terminals tends to be narrowed. In general, a plurality of terminals are densely arranged in an array on the bottom of an IC chip, and the terminal group is connected to terminal group on a mother board by flip-chip bonding. However, there is a large difference between the pitch between the terminals in the terminal group of the IC chip and the pitch between the terminals in the terminal group of the mother board, and thus it is difficult to directly connect the IC chip to the mother board. Accordingly, in general, a package is used for mounting a wiring board for mounting the IC chip, and the package is mounted on the mother board.

As a wiring board for mounting the IC chip, a multi-layer wiring board is practically used that includes build-up layers formed on the front and rear surfaces of a core substrate. In the multi-layer wiring board, for example, a resin substrate (for example, a glass epoxy substrate) formed by impregnating a resin with a reinforcing fiber is used as the core substrate. A plurality of insulating layers and conductor layers are alternately formed on the front surface and the rear surface of the core substrate using the rigidity of the core substrate, and thus the build-up layers are formed. That is, in the multi-layer wiring board, the core substrate serves as a reinforcing member, and has a thickness that is considerably larger than that of the build-up layer. In addition, wiring lines (e.g., through-hole conductors) for electrically connecting each of layers in the build-up layers formed on the front surface and the rear surface are formed on the core substrate so as to pass through the core substrate.

Further, in recent years, with an increase in the process speed of a semiconductor integrated circuit device, signals in a high frequency band have been used. In this case, the wiring lines passing through the core substrate serve as large inductance, and thus the transmission loss of high-frequency signals or the malfunction of a circuit occurs, which makes it difficult to improve the process speed. In order to address this problem, a coreless wiring board without a core substrate has been proposed as the wiring board for mounting the IC chip (e.g., see Japanese Patent No. 3664720). Since the coreless wiring board does not include the core substrate having a relatively large thickness, the overall length of wiring lines is shortened. Therefore, it is possible to reduce the transmission loss of high-frequency signals and operate a semiconductor integrated circuit device at a high speed.

Also, since the coreless wiring board is manufactured without a core substrate, it is difficult to sufficiently ensure the strength of the coreless wiring board. Accordingly, in the related art, a frame is bonded to a device mounting surface for mounting an IC chip to reinforce the strength, thereby ensuring the strength of the coreless wiring board. The frame is provided at the edge of the substrate so as to surround the IC chip. In addition, Japanese Patent No. 3664720 describes that a metal plate subjected to an insulating process is adhered and fixed to a rear surface opposite to the device mounting surface, and then the coreless wiring board is interposed between the frame and the metal plate to ensure the strength of the wiring board, thereby preventing bending of the wiring board. In the coreless wiring board, a plurality of through-holes for exposing external connection terminal pads are formed in a metal reinforcing plate provided on the rear surface.

When the coreless wiring board is a pin grid array (PGA) package type, as shown in FIG. 15, PGA pads 81 are provided on the rear surface of a coreless wiring board 80, and terminal pins 82 are soldered to the PGA pads 81. Then, a reinforcing plate 85 made of a metal material is fixed in a surface contact state to the rear surface of the coreless wiring board 80 by an adhesive layer 84. Through holes 87 each having a diameter that is larger than that of a head portion 86 of the terminal pin 82 are formed in the reinforcing plate 85, and shaft portions 88 of the pin terminals 82 are inserted into the through holes 87. As such, since a plurality of through holes 87 having a relatively large diameter are formed in the reinforcing plate 85 of the coreless wiring board 80, the strength of the reinforcing plate 85 is lowered, and it is difficult to obtain a sufficient adhesive area of the reinforcing plate 85. As a result, the rigidity of the wiring board 80 is insufficient. In addition, mismatching between coefficients of thermal expansion (CTE) occurs in portions of the reinforcing plate 85 in which the through holes 87 are formed, in the rear surface of the coreless wiring board 80. As a result, the reliability of the wiring board 80 is lowered.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any of the problems described above.

Accordingly, it is an aspect of the present invention to provide a multi-layer wiring board capable of sufficiently improving the strength thereof and reducing a region in which mismatching between coefficients of thermal expansion occurs, and a method of manufacturing the same.

According to one or more aspects of the present invention, there is provided a multi-layer wiring board without a core substrate. The multi-layer wiring board comprises: a multi-layer laminated structure which is formed by alternatively laminating a plurality of wiring layers and a plurality of insulating layers; a plurality of first terminal pads which are provided on a front surface of the multi-layer laminated structure on which a semiconductor integrated circuit device is to be mounted; a plurality of second terminal pads which are provided on a rear surface of the multi-layer laminated structure opposite to the front surface and which are to be electrically connected to another board; a plurality of terminal pins bonded to a corresponding one of the second terminal pads, wherein each of the terminal pins is formed in a nailhead shape that includes a shaft portion and a head portion, and a diameter of the head portion is larger than that of the shaft portion; and a reinforcing plate which has a plurality of pin insertion openings formed at positions corresponding to the terminal pins and which is fixed to the rear surface, wherein the diameter of the pin insertion openings is smaller than the diameter of the head portion and is larger than the diameter of the shaft portion.

According to the multi-layer wiring board, a plurality of second terminal pads for electrical connection to an external substrate are provided on the rear surface of the multi-layer wiring board, and the terminal pins are bonded to the second terminal pads. In addition, the reinforcing plate that has the pin insertion openings formed at positions corresponding to the terminal pins is fixed to the rear surface of the multi-layer wiring board in a surface contact state. The diameter of the pin insertion opening provided in the reinforcing plate is smaller than the diameter of the head portion of the terminal pin having a nailhead shape and is larger than the diameter of the shaft portion of the terminal pin. As such, since the diameter of the pin insertion opening is reduced, it is possible to improve the rigidity of the reinforcing plate, and ensure a sufficient adhesion area of the reinforcing plate to the rear surface of the substrate. As a result, the rigidity of a multi-layer wiring board is improved. In addition, it is possible to reduce a region in which mismatching between coefficients of thermal expansion (CTE) occurs by increasing the area reinforced by the reinforcing plate in the rear surface of the multi-layer wiring board. As a result, it is possible to improve the reliability of the multi-layer wiring board. Also, it is advantageous that the reinforcing plate is fixed to the rear surface in a surface contact state.

The material forming the reinforcing plate can be formed of either a metal material or a non-metal material. Particularly, it is advantageous that the reinforcing plate is made of a non-metal material. The reinforcing plate made of a non-metal material has a workability that is higher than that made of a metal material. Therefore, it is possible to easily form the pin insertion openings at positions corresponding to the second terminal pads, and it is also possible to reduce a material cost.

The reinforcing plate made of a non-metal material may be mainly formed of a synthetic resin. Specifically, the terminal pins are soldered to the second terminal pads on the rear surface of the multi-layer wiring board. In the multi-layer wiring board, in order to reliably solder the terminal pins, a solder resist is formed so as to cover the rear surface of the substrate, and openings that expose the second terminal pads are formed in the solder resist. In addition, the solder resist may be formed of a resin material having high heat resistance. When a reinforcing plate is made of a synthetic resin, it is possible to firmly adhere and fix the reinforcing plate to the solder resist made of a resin material.

A metal material such as copper, copper alloy, aluminum, aluminum alloy, nickel, nickel alloy, iron, iron alloy, tin, tin alloy or the like can be used as the reinforcing plate. Since a reinforcing plate made of metal material has the rigidity that is higher than that of a reinforcing plate made of non-metal material, the multi-layer wiring board according to the embodiment can be surely reinforced, and also radiation performance of the multi-layer wiring board can be improved.

Also, although the reinforcing plate is bonded to the rear surface by any means, it is advantageous that the reinforcing plate is bonded to the rear surface by the adhesive layer. In case of using the adhesive layer, it is possible to firmly adhere and fix the reinforcing plate to the rear surface of the multi-layer laminated structure. Particularly, the use of the adhesive is advantageous when the reinforcing plate made of metal material is bonded to the rear surface of the multi-layer laminated structure which is covered with the solder resist having openings formed therein, each of which exposes a corresponding one of the second terminal pads. This is because it is possible to bond metal and synthetic resin, which are different material from each other, relatively easily and firmly. In this case, it is advantageous that the reinforcing plate is bonded to the head portion of the terminal pin via the adhesive layer. Also, it is advantageous that the adhesive layer intrudes into a gap between the solder resist and the head portion on the second terminal pad. According to this structure, since an air gap near the head portion of the terminal pin is reduced, it is possible to improve the reliability as well as the strength of fixing the terminal pin. Also, it is advantageous that the adhesive layer intrudes into a gap between the shaft portion of the terminal pin and pin insertion opening formed in the reinforcing plate. According to this structure, it is possible to further improve the reliability as well as the strength of fixing the terminal pin.

Examples of the multi-layer wiring substrate without a core according to the aspects of the present invention include a "multi-layer wiring substrate mainly having interlayer insulating layers of a same configuration" and a "multi-layer wiring substrate in which conductor layers are connected to each other by only via holes having diameters extending in the same direction."

The insulating layer may be selected in light of, for example, an insulating property, heat resistance, and humidity resistance. The insulating layer may be formed of any of the following materials: thermosetting resins, such as epoxy resin, phenol resin, urethane resin, silicon resin, and polyimide resin; and thermoplastic resins, such as polycarbonate resin, acrylic resin, polyacetal resin, and polypropylene resin. Among the resin materials, for example, a composite material of the resin and inorganic fiber such as glass fiber (glass woven fabric or glass nonwoven fabric), a composite material of the resin and organic fiber such as polyamide fiber, or a resin-resin composite material obtained by impregnating a three-dimensional net-shaped fluorine-based resin base, such as expanded PTFE, with thermosetting resin, such as epoxy resin, may be used.

The wiring layers are patterned on the insulating layers by a subtractive method, a semi-additive method, or a full additive method, for example. For example, the conductor layer may be formed of a metal material, such as copper, copper alloy, nickel, nickel alloy, tin, or tin alloy.

In addition, a lead terminal made of, for example, a Cu alloy or an iron-nickel-cobalt alloy may be used as the terminal pin. The terminal pin may be fixed to the second terminal pad by, for example, soldering.

According to one or more aspects of the present invention, there is provided a method of manufacturing the multi-layer wiring board. The method comprises: (a) providing a multi-layer laminated structure which is formed by alternatively laminating a plurality of wiring layers and a plurality of insulating layers, wherein a plurality of first terminal pads are provided on a front surface of the multi-layer laminated structure, and a plurality of second terminal pads are provided on a rear surface of the multi-layer laminated structure opposite to the front surface; (b) providing a reinforcing plate which has a plurality of pin insertion openings formed therein, wherein an adhesive layer in non-hardened state is provided on one surface of the reinforcing plate; (c) soldering each of a plurality of terminal pins to a corresponding one of the second terminal pads; (d) inserting each of shaft portions of the terminal pins into a corresponding one of the pin insertion openings; (e) fixing the reinforcing plate to the rear surface by an adhesive layer in a surface contact state; and (f) hardening the adhesive layer in a non-hardened state at a temperature that is lower than a solder melting temperature.

According to the method of manufacturing the multi-layer wiring board, after the terminal pins are soldered to the second terminal pads in the pin connecting step, the reinforcing plate is fixed to the rear surface of the substrate in a surface contact state in the reinforcing plate adhering step. As such, when the reinforcing plate adhering step is performed after the pin connecting step, it is possible to make the diameter of the pin insertion opening formed in the reinforcing plate smaller than that of the head portion of the terminal pin. Thus, it is possible to improve the rigidity of the reinforcing plate, and ensure a sufficient adhesion area of the reinforcing plate to the rear surface of the substrate, thereby improving the rigidity of a multi-layer wiring board. In addition, it is possible to reduce a region in which mismatching between coefficients of thermal expansion (CTE) occurs in the rear surface of the multi-layer wiring board. As a result, it is possible to improve the reliability of the multi-layer wiring board. Furthermore, in the hardening process, the adhesive layer in a non-hardened state is hardened at a temperature that is lower than a solder melting temperature. Therefore, it is possible to prevent a soldering portion that bonds the terminal pin to the second terminal pad from being melted.

DETAILED DESCRIPTION OF EXEMPLARY EMBODIMENTS

Exemplary embodiments of the present invention will be described with reference to the drawings hereinafter.

Figure 1:
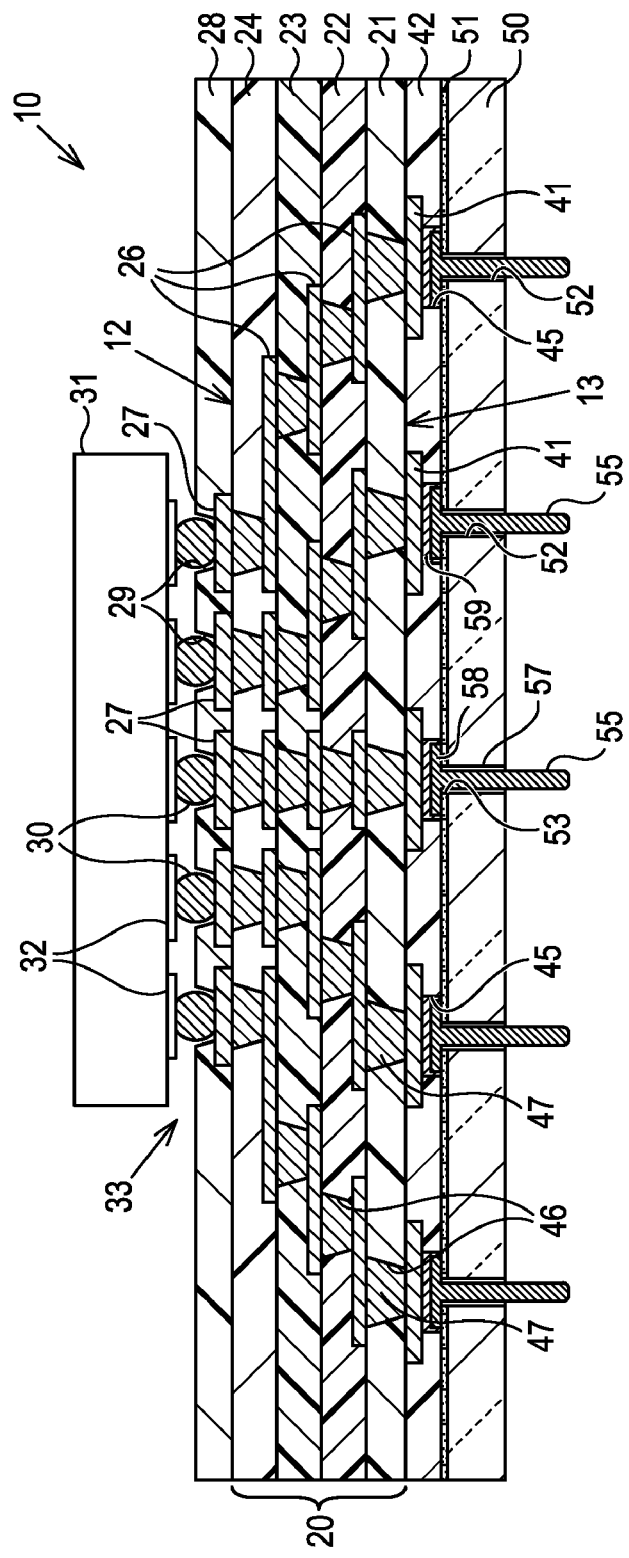
FIG. 1 is a cross-sectional schematic view illustrating the structure of a coreless wiring board according to an exemplary embodiment of the present invention.

FIG. 1 is a cross-sectional schematic view illustrating the structure of a coreless wiring board (multi-layer wiring board) according to the exemplary embodiment.

As shown in FIG. 1, a coreless wiring board 10 does not include a core substrate, and includes a multi-layer laminated structure obtained by alternately forming four resin insulating layers (interlayer insulating layers) 21, 22, 23, and 24 made of epoxy resin and conductor layers 26 made of copper. The resin insulating layers 21 to 24 are interlayer insulating layers that have the same thickness and are made of the same material, and are formed of a sheet-shaped build-up material made of epoxy resin.

Terminal pads 27 (connection terminals on front surface side) are arranged in an array on a front surface 12 of the coreless wiring board 10 (the front surface of the fourth resin insulating layer 24). In addition, a solder resist 28 covers substantially the entire front surface of the resin insulating layer 24. Openings 29 that expose the terminal pads 27 are formed in the solder resist 28. A plurality of solder bumps 30 are provided on the surfaces of the terminal pads 27. Each of the solder bumps 30 is electrically connected to a corresponding one of surface connection terminals 32 of an IC chip 31 (semiconductor integrated circuit device) which is formed in a rectangular flat plate shape. The terminal pads 27 and the solder bumps 30 are formed in an IC chip mounting region 33 capable of mounting the IC chip 31.

Pin grid array (PGA) pads 41 (connection terminals on the rear surface side) are provided in an array on a rear surface 13 of the coreless wiring board 10 (the lower surface of the first resin insulating layer 21). In addition, a solder resist 42 covers substantially the entire lower surface of the resin insulating layer 21. Openings 45 (solder resist openings) that expose the PGA pads 41 are formed in the solder resist 42 at positions corresponding to the PGA pads 41. In addition, via holes 46 and via conductors 47 are formed in each of the resin insulating layers 21, 22, 23, and 24. The via hole 46 has an inverted truncated cone shape, for example, and is formed by holing each of the resin insulating layers 21 to 24 using a YAG laser or a carbon dioxide gas laser. The diameters of the via conductors 47 extend in the same direction (the upward direction in FIG. 1), and each of the via conductors 47 electrically connects the conductor layer 26, the terminal pad 27, and the PGA pad 41. In addition, terminal pins 55 are soldered to the PGA pads 41. The PGA pads 41 are electrically connected to a mother board (not shown) by the terminal pins 55.

Figure 2:
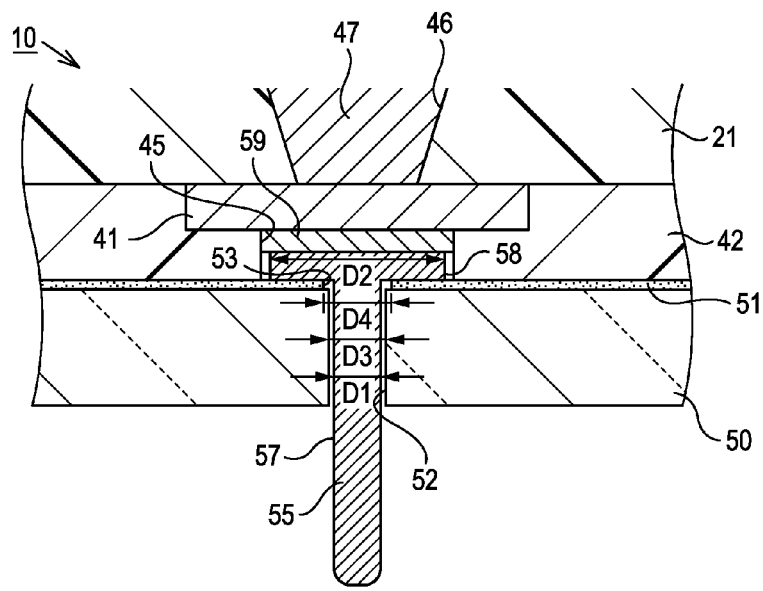
FIG. 2 is an enlarged cross-sectional view illustrating a main part of the coreless wiring board according to the exemplary embodiment.

As shown in FIGS. 1 and 2, in the coreless wiring board 10 according to the exemplary embodiment, a reinforcing plate 50 is adhered and fixed in a surface contact state to the solder resist 42 on the rear surface 13 by an adhesive layer 51. A plate that is made of a non-metal material and has a thickness of about 0.5 mm may be used as the reinforcing plate 50. For example, a glass epoxy substrate made of epoxy resin and glass fiber may be used as the reinforcing plate. A plurality of openings 52 (pin insertion openings) are formed in the reinforcing plate 50 at positions corresponding to the plurality of terminal pins 55.

The adhesive layer 51 is a hardened material of a thermosetting resin having high heat resistance. For example, the adhesive layer 51 is formed by hardening a film-shaped adhesive sheet made of an epoxy resin. A plurality of openings 53 are formed in the adhesive layer 51 at positions corresponding to the plurality of terminal pins 55.

In the exemplary embodiment, the plurality of PGA pads 41 are formed in circular shapes in a plan view, and the openings 45, 52, and 53 respectively formed in the solder resist 42, the reinforcing plate 50, and the adhesive layer 51 have circular shapes in a plan view.

As shown in FIG. 2, the terminal pin 55 has a nailhead shape including a shaft portion 57 and a head portion 58 having a diameter that is larger than that of the shaft portion 57, and the head portion 58 is connected to the PGA pad 41 with a soldering portion 59 interposed therebetween. In addition, the shaft portion 57 of the terminal pin 55 passes through the opening 52 of the reinforcing plate 50 and the leading end of the shaft portion 57 protrudes from the lower surface of the reinforcing plate 50. In the exemplary embodiment, the diameter D1 of the opening 52 formed in the reinforcing plate 50 is smaller than the diameter D2 of the head portion 58 of the terminal pin 55, and is larger than the diameter D3 of the shaft portion 57.

In addition, the diameter D4 of the opening 53 of the adhesive layer 51 is smaller than the diameter D2 of the head portion 58 of the terminal pin 55, and is larger than the diameter D3 of the shaft portion 57. That is, the adhesive layer 51 is fixed in a surface contact state to the solder resist 42 and the lower surface of the head portion 58 of each terminal pin 55. In addition, the diameter D4 of the opening 53 of the adhesive layer 51 is slightly larger than the diameter D1 of the opening 52 of the reinforcing plate 50, and the adhesive layer 51 does not protrude toward the inside of the opening 52 of the reinforcing plate 50.

For example, the coreless wiring board 10 having the above-mentioned structure is manufactured as follows.

In the exemplary embodiment, a supporting substrate (for example, a glass epoxy substrate) having sufficient strength is prepared, and the resin insulating layers 21 to 24 and the conductor layers 26 of the coreless wiring board 10 are built up on the supporting substrate. FIGS. 3 to 13 are diagrams illustrating the manufacturing method, and show, for example, the resin insulating layers 21 to 24 and the conductor layers 26 formed on the upper surface of the supporting substrate. Although not shown in the drawings, the resin insulating layers 21 to 24 and the conductor layers 26 are similarly formed on the lower surface of the supporting substrate.

Figure 3:
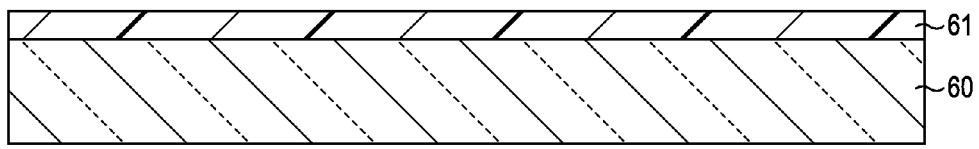
FIG. 3 is a diagram illustrating a method of manufacturing the coreless wiring board according to the exemplary embodiment.
Figure 4:
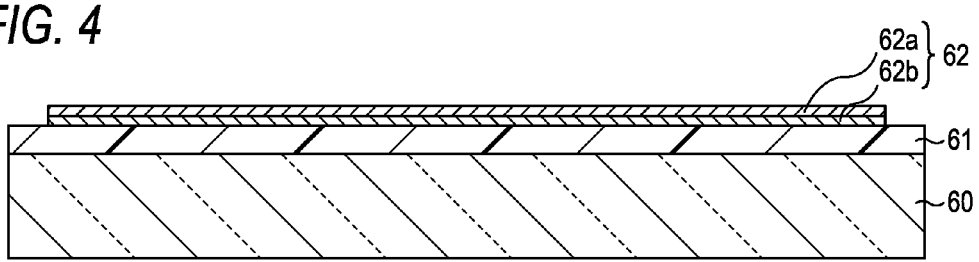
FIG. 4 is a diagram illustrating the method of manufacturing the coreless wiring board according to the exemplary embodiment.

Specifically, as shown in FIG. 3, a sheet-shaped insulating resin base made of epoxy resin is adhered onto the upper surface of a supporting substrate 60 in a partially hardened state so as to form an underlying resin insulating layer 61. Then, as shown in FIG. 4, a laminated metal sheet 62 is provided on the upper surface of the underlying resin insulating layer 61. Since the laminated metal sheet 62 is provided on the underlying resin insulating layer 61 in a partially hardened state, it possible to ensure sufficient adhesion to prevent the laminated metal sheet 62 from being peeled off from the underlying resin insulating layer 61 in the subsequent manufacturing process. The laminated metal sheet 62 is formed by closely adhering two copper foils 62a and 62b such that they can be peeled off from each other. Specifically, metal plating (for example, chrome plating) is performed to laminate the two copper foils 62a and 62b, thereby forming the laminated metal sheet 62.

Figure 5:
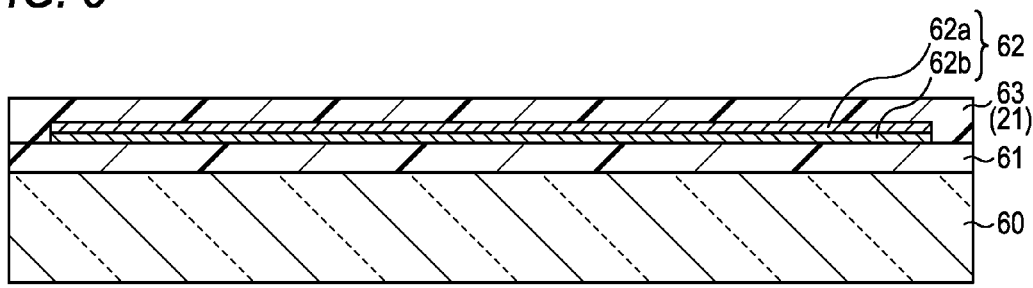
FIG. 5 is a diagram illustrating the method of manufacturing the coreless wiring board according to the exemplary embodiment.

Then, as shown in FIG. 5, the sheet-shaped insulating resin base 63 is arranged so as to cover the laminated metal sheet 62, and a vacuum heat press machine (not shown) is used to press and heat the sheet-shaped insulating resin base 63 in a vacuum atmosphere, thereby hardening the insulating resin base 63. Thus, the first resin insulating layer 21 is formed. The resin insulating layer 21 is closely adhered to the laminated metal sheet 62, and is also closely adhered to the underlying resin insulating layer 61 in a peripheral region of the laminated metal sheet 62 to seal the laminated metal sheet 62.

Figure 6:
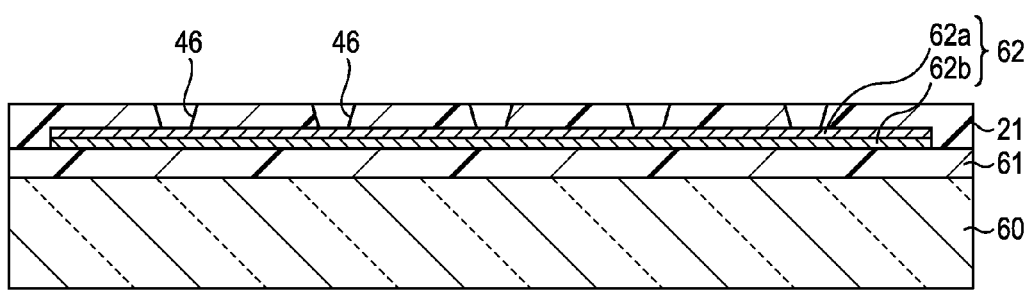
FIG. 6 is a diagram illustrating the method of manufacturing the coreless wiring board according to the exemplary embodiment.
Figure 7:
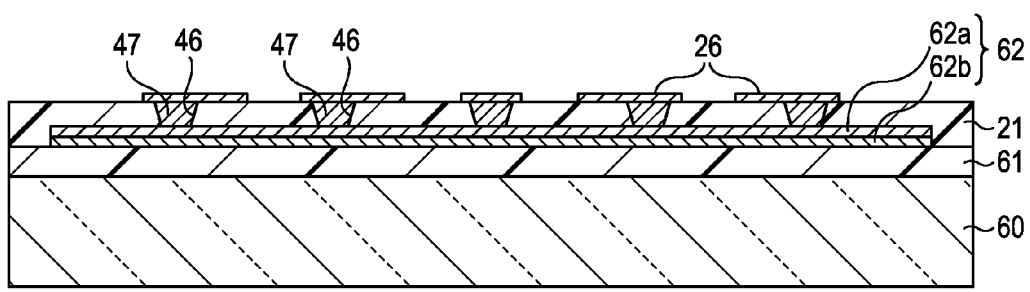
FIG. 7 is a diagram illustrating the method of manufacturing the coreless wiring board according to the exemplary embodiment.

Then, as shown in FIG. 6, a laser is used to form the via holes 46 in the resin insulating layer 21 at given positions, and then a desmear process of removing smears in the via holes 46 is performed. Then, electroless copper plating and electrolytic copper plating are performed to form the via conductor 47 in each of the via holes 46 and to form the conductor layer 26 on the resin insulating layer 21. In addition, etching is performed by, for example, a semi-additive method to pattern the conductor layer 26 on the resin insulating layer 21 (see FIG. 7).

The second to fourth resin insulating layers 22 to 24 and the conductor layers 26 are built up on the resin insulating layer 21 by the same method as the forming method of the first resin insulating layer 21 and the conductor layer 26. Then, a photosensitive epoxy resin is applied onto the resin insulating layer 24 having the terminal pads 27 formed thereon and then hardened to form the solder resist 28. Then, a certain mask is placed on the solder resist, and exposure and development are performed to pattern the solder resist 28, thereby forming the openings 29. Thus, a laminated body 70, which includes the laminated metal sheet 62, the resin insulating layers 21 to 24, and the conductor layers 26, is formed on the supporting substrate 60 (see FIG. 8). In the laminated body 70, a region (multi-layer) disposed on the laminated metal sheet 62 is a wiring laminated portion 20 (laminated structure) serving as the coreless wiring board 10.

Figure 8:
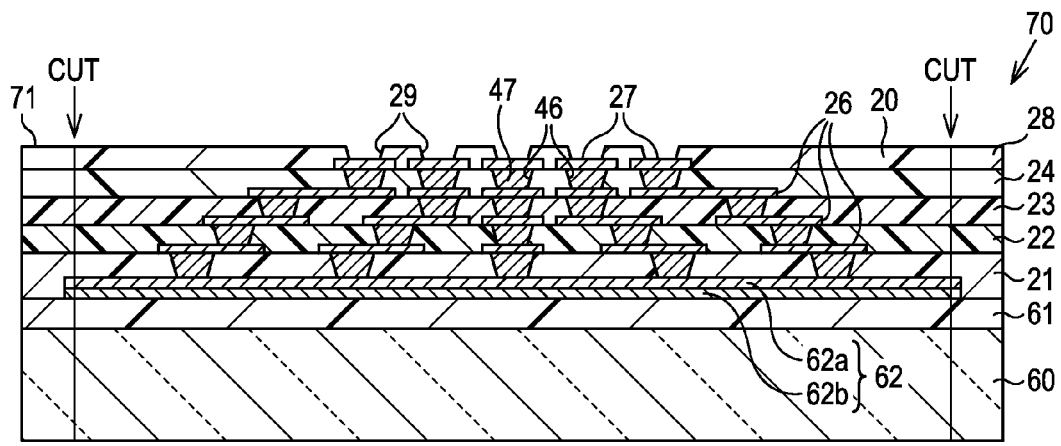
FIG. 8 is a diagram illustrating the method of manufacturing the coreless wiring board according to the exemplary embodiment.

A dicing machine (not shown) is used to cut the laminated body 70, thereby removing a peripheral region of the wiring laminated portion 20 of the laminated body 70. In this case, as shown in FIG. 8, the underlying resin insulating layer 61 and the supporting substrate 60 below the wiring laminated portion 20 are also cut at the boundary between the wiring laminated portion 20 and the peripheral portion 71 thereof. By this cutting process, the edge of the laminated metal sheet 62 sealed by the resin insulating layer 21 is exposed. That is, when the peripheral portion 71 is removed, a close contact portion between the underlying resin insulating layer 61 and the resin insulating layer 21 is also removed. As a result, the wiring laminated portion 20 and the supporting substrate 60 are connected to each other by only the laminated metal sheet 62.

Figure 9:
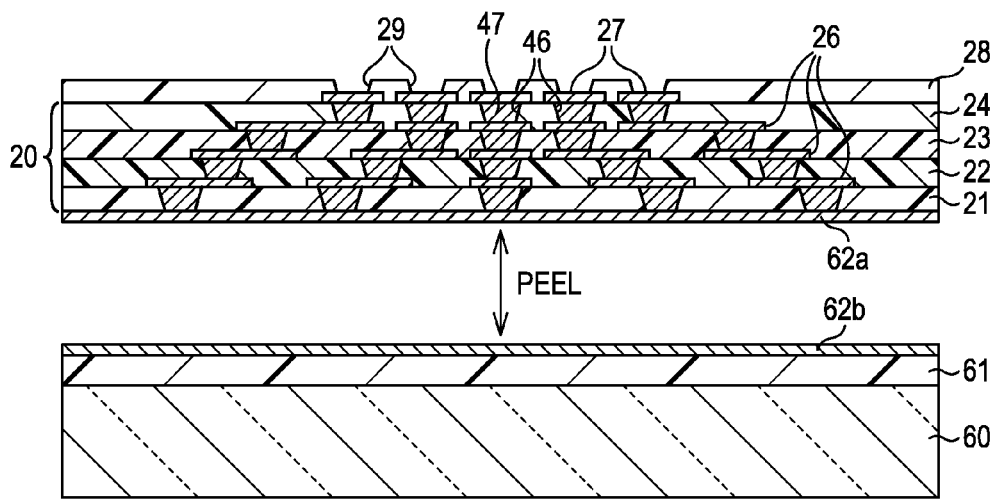
FIG. 9 is a diagram illustrating the method of manufacturing the coreless wiring board according to the exemplary embodiment.
Figure 10:
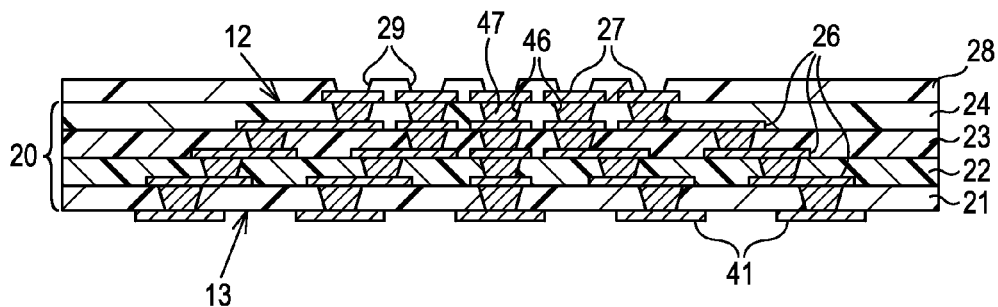
FIG. 10 is a diagram illustrating the method of manufacturing the coreless wiring board according to the exemplary embodiment.

As shown in FIG. 9, the wiring laminated portion 20 is separated from the supporting substrate 60 at the interface between the two copper foils 62a and 62b of the laminated metal sheet 62. Then, as shown in FIG. 10, the copper foil 62a on the rear surface 13 (the lower surface) of the wiring laminated portion 20 (resin insulating layer 21) is patterned by etching to form the PGA pads 41. Then, a photosensitive epoxy resin is applied onto the resin insulating layer 21 having the PGA pads 41 formed thereon and then hardened to form the solder resist 42 such that the solder resist covers the rear surface 13 of the wiring laminated portion 20. Then, a certain mask is placed on the solder resist, and exposure and development are performed to pattern the solder resist 42, thereby forming the openings 45.

Figure 11:
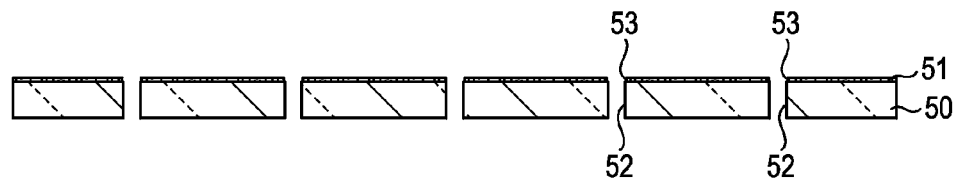
FIG. 11 is a diagram illustrating the method of manufacturing the coreless wiring board according to the exemplary embodiment.

In this way, the wiring laminated portion 20 including the conductor layers 26 and the resin insulating layers 21 to 24 alternately laminated is prepared. Then, as shown in FIG. 11, the reinforcing plate 50 having a plurality of openings 52 formed therein and the adhesive layer 51 in a non-hardened state formed on one surface thereof is prepared (preparation process). For example, the openings 52 of the reinforcing plate 50 are formed by a drilling process using a drilling machine. In addition, for example, the openings 53 of the adhesive layer 51 are formed by punching a film-shaped adhesive sheet using a punching mold.

Figure 12:
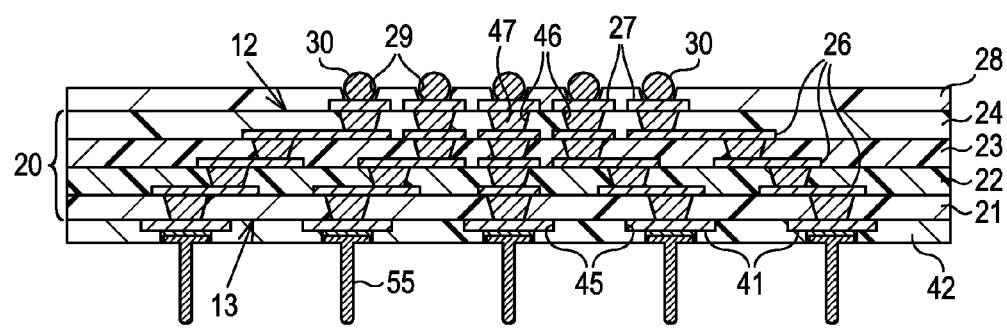
FIG. 12 is a diagram illustrating the method of manufacturing the coreless wiring board according to the exemplary embodiment.

Then, as shown in FIG. 12, the terminal pins 55 are soldered to the plurality of PGA pads 41 formed on the rear surface 13 of the wiring laminated portion 20 (pin connecting process). In addition, the solder bumps 30 are formed on a plurality of terminal pads 27 formed on the front surface 12 of the wiring laminated portion 20. Specifically, a solder ball mounting apparatus (not shown) is used to arrange the solder balls on the terminal pads 27, and the solder balls are heated at a predetermined temperature to reflow. In this way, the solder bumps 30 are formed on the terminal pads 27.

Figure 13:
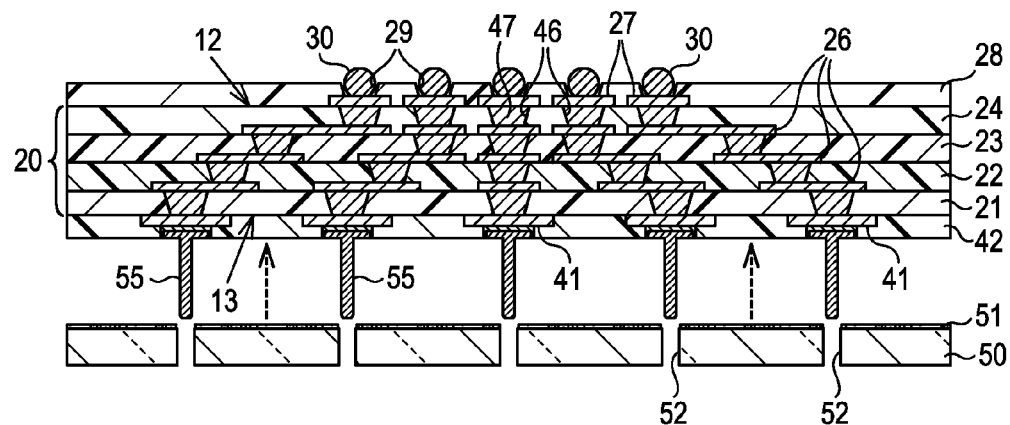
FIG. 13 is a diagram illustrating the method of manufacturing the coreless wiring board according to the exemplary embodiment.

Then, as shown in FIG. 13, the shaft portions 57 of the terminal pins 55 are inserted into the openings 52 of the reinforcing plate 50 and the reinforcing plate 50 is fixed in a surface contact state to the solder resist 42 by the adhesive layer 51 (reinforcing plate adhering process). Then, heating is performed at a temperature (for example, 150° C.) that is lower than a solder melting temperature (for example, 210° C.) of the soldering portion 59 to harden the adhesive layer 51 in a non-hardened state (hardening process). Thus, the coreless wiring board 10 shown in FIG. 1 is obtained.

Therefore, according to the exemplary embodiment, the following effects can be obtained.

(1) The reinforcing plate 50 having the openings 52 formed at positions corresponding to the terminal pins 55 is fixed in a surface contact state to the rear surface 13 of the coreless wiring board 10 according to the exemplary embodiment. The diameter D1 of the opening 52 formed in the reinforcing plate 50 is smaller than the diameter D2 of the head portion 58 of the terminal pin 55, and is larger than the diameter D3 of the shaft portion 57. As such, since the diameter of the opening 52 of the reinforcing plate 50 is smaller than the diameter of the head portion 58 of the terminal pin 55, it is possible to improve the rigidity of the reinforcing plate 50 and ensure a sufficient adhesion area of the reinforcing plate 50 to the rear surface 13 of the substrate, thereby improving the rigidity of the coreless wiring board 10. As a result, in a process of mounting the IC chip 31 on the coreless wiring board 10, it is possible to reliably position the coreless wiring board 10 without bending or damaging the coreless wiring board 10. In addition, it is possible to reduce a region in which mismatching between coefficients of thermal expansion (CTE) occurs, in the rear surface 13 of the coreless wiring board 10. As a result, it is possible to improve the reliability of the coreless wiring board 10.

(2) In the coreless wiring board 10 according to the exemplary embodiment, the resin reinforcing plate 50, which is a glass epoxy substrate, is adhered and fixed to the solder resist 42 in a surface contact state. Therefore, it is possible to obtain sufficient adhesion strength, as compared to the related art in which a metal reinforcing plate 85 is fixed. In addition, since the reinforcing plate 50 is made of a resin material, it has high workability. Therefore, it is possible to easily form the openings 52 at positions corresponding to the terminal pins 55, and it is also possible to reduce a material cost.

(3) In the coreless wiring board 10 according to the exemplary embodiment, in the hardening process, the adhesive layer 51 in a non-hardened state is hardened at a temperature that is lower than a solder melting temperature. Therefore, it is possible to prevent the soldering portion 59 that bonds the terminal pin 55 from being melted.

The exemplary embodiment of the present invention may be modified as follows.

In the coreless wiring board 10 according to the above-described embodiment, after the terminal pins 55 are soldered to the PGA pads 41 in the pin connecting process, the reinforcing plate 50 is fixed by the adhesive layer 51. However, exemplary embodiments of the present invention are not limited thereto. For example, the following manufacturing method may be used: the shaft portions 57 of the terminal pins 55 are inserted into the openings 52 of the reinforcing plate 50 with the adhesive layer 51 being temporarily adhered to one surface of the reinforcing plate 50; the lower surfaces of the head portions 58 of the terminal pins 55 are adhered to the adhesive layer 51 such that the terminal pins 55 are fixed to the reinforcing plate 50; and the head portion 58 of each of the terminal pins 55 fixed to the reinforcing plate 50 is soldered to the PGA pad 41 and the reinforcing plate 50 is fixed in a surface contact state to the solder resist 42 by the adhesive layer 51. In this case, it is also possible to obtain the coreless wiring board 10 shown in FIG. 1.

In the coreless wiring board 10 according to the above-described embodiment, the reinforcing plate 50 is formed of a glass epoxy substrate, but exemplary embodiments of the present invention are not limited thereto. Specifically, for example, a small amount of metal powder (for example, copper filler) capable of maintaining an insulating property may be mixed with a synthetic resin material to form the reinforcing plate 50. In this case, it is possible to improve the heat dissipation performance of the reinforcing plate 50.

In the coreless wiring board 10 according to the above-described embodiment, the rear surface 13 is covered with the solder resist 42, and the reinforcing plate 50 is adhered and fixed in a surface contact state to the solder resist 42, but exemplary embodiments of the present invention are not limited thereto. For example, the reinforcing plate 50 may be fixed to the coreless wiring board 10 in a surface contact state.

In the coreless wiring board 10 according to the above-described embodiment, the reinforcing plate 50 is adhered to the solder resist 42 on the rear surface 13 by the adhesive layer 51, but may be adhered to the solder resist 42 using any means instead of the adhesive layer 51. For example, it is possible to allow the solder resist 42 to substantially serve as an adhesive layer when the solder resist 42 is made in non-hardened state and then hardened. Thus, the reinforcing plate 50 can be adhered to the solder resist 42.

Figure 14:
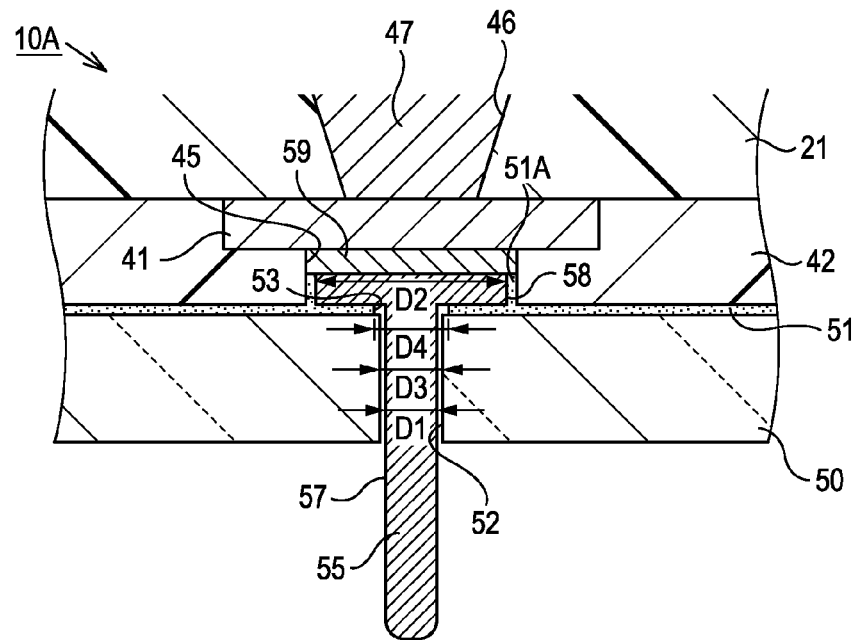
FIG. 14 is a cross-sectional schematic view illustrating the structure of a coreless wiring board according to another exemplary embodiment of the present invention.
Figure 15:
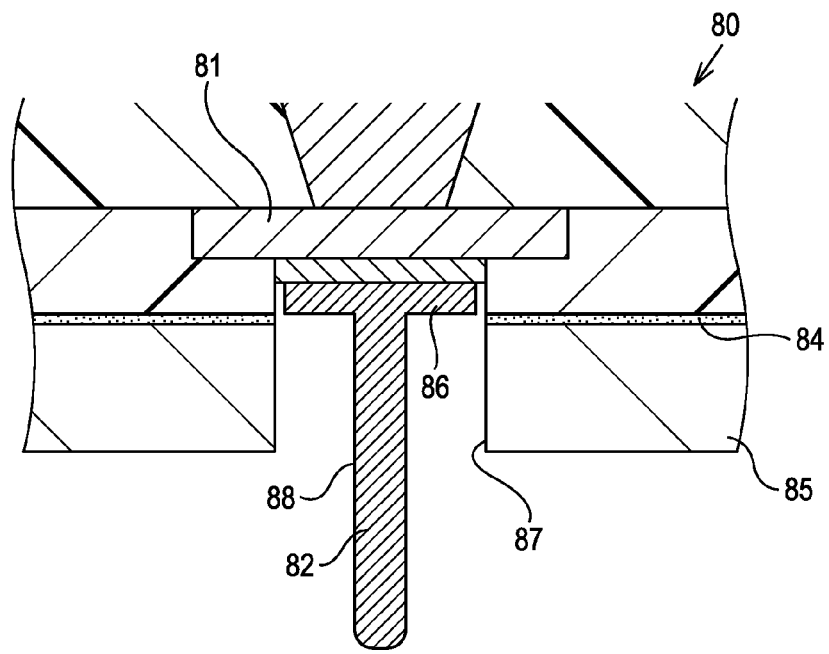
FIG. 15 is an enlarged cross-sectional view illustrating a main part of the coreless wiring board in the related art.

According to exemplary embodiments of the present invention, a coreless wiring board 10A may be employed, as shown in FIG. 14. That is, also in the coreless wiring board 10A, the reinforcing plate 50 is adhered to the solder resist 42 on the rear surface 13 by the adhesive layer 51. However, in this embodiment, the adhesive layer 51 intrudes into a gap between the solder resist 42 and the head portion 58 on the PGA pad 41 (see 51A in FIG. 14). As a result, the adhesive layer 51 and the head portion 58 is bonded to each other via the adhesive layer 51. According to this structure, since an air gap near the head portion 58 of the terminal pin 55 is reduced, it is possible to improve the reliability as well as the strength of fixing the terminal pin 55.

While the present invention has been shown and described with reference to certain example embodiments, other implementations are within the scope of the claims. It will be understood by those skilled in the art that various changes in form and details may be made therein without departing from the spirit and scope of the invention as defined by the appended claims.

What is claimed is:

1. A multi-layer wiring board without a core substrate, comprising:
    a multi-layer laminated structure which is formed by alternatively laminating a plurality of wiring layers and a plurality of insulating layers;
    a plurality of first terminals which are provided on a front surface of the multi-layer laminated structure on which a semiconductor integrated circuit device is to be mounted;
    a plurality of second terminals which are provided on a rear surface of the multi-layer laminated structure opposite to the front surface and which are to be electrically connected to another board;
    a solder resist formed of a resin material substantially covering the rear surface and having a plurality of openings formed therein, each of the plurality of openings exposing a corresponding one of the plurality of second terminals;
    a plurality of terminal pins bonded to a corresponding one of the second terminals, wherein each of the terminal pins is formed in a nailhead shape that includes a shaft portion and a head portion, and a diameter of the head portion is larger than that of the shaft portion; and
    a reinforcing plate which has a plurality of pin insertion openings formed at positions corresponding to the plurality of terminal pins and which is fixed to the solder resist, wherein the diameter of the pin insertion openings is smaller than the diameter of the head portion and is larger than the diameter of the shaft portion;
    wherein the reinforcing plate is mainly formed of a synthetic resin and is bonded to the solder resist by an adhesive.

2. The multi-layer wiring board according to claim 1, wherein the reinforcing plate is bonded to the head portions by the adhesive.

3. The multi-layer wiring board according to claim 1, wherein
    the adhesive is interposed between the head portion and the solder resist on the second terminal.

4. The multi-layer wiring board according to claim 1,
    wherein the adhesive is an adhesive layer having a plurality of openings at positions corresponding to the plurality of terminal pins and the plurality of pin insertion openings of the reinforcing plate; and
    wherein a diameter of each of the plurality of openings of the adhesive layer is larger than the diameter of the corresponding pin insertion opening of the reinforcing plate and is smaller than the diameter of head portion of the corresponding terminal pin.

5. A method of manufacturing the multi-layer wiring board, the method comprising:
    (a) providing a multi-layer laminated structure which is formed by alternatively laminating a plurality of wiring layers and a plurality of insulating layers, wherein a plurality of first terminals are provided on a front surface of the multi-layer laminated structure, a plurality of second terminals are provided on a rear surface of the multi-layer laminated structure opposite to the front surface, and a solder resist formed of a resin material substantially covers the rear surface and has a plurality of openings formed therein, each of the plurality of openings exposing a corresponding one of the plurality of second terminals;
    (b) providing a reinforcing plate which is mainly formed of a synthetic resin and has a plurality of pin insertion openings formed therein, wherein an adhesive layer in non-hardened state is provided on one surface of the reinforcing plate;
    (c) soldering each of a plurality of terminal pins to a corresponding one of the second terminals;
    (d) inserting each of shaft portions of the terminal pins into a corresponding one of the pin insertion openings;
    (e) fixing the reinforcing plate to the solder resist by the adhesive layer in a surface contact state; and
    (f) hardening the adhesive layer in a non-hardened state at a temperature that is lower than a solder melting temperature.

* * * * *